US012690310B2

(12) United States Patent
Li et al.

(10) Patent No.: US 12,690,310 B2
(45) Date of Patent: Jul. 21, 2026

(54) DISPLAY DEVICE AND MANUFACTURING METHOD OF DISPLAY DEVICE

(71) Applicant: TCL CHINA STAR OPTOELECTRONICS TECHNOLOGY CO., LTD., Shenzhen (CN)

(72) Inventors: Linshuang Li, Shenzhen (CN); Zhuhui Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 784 days.

(21) Appl. No.: 17/756,643

(22) PCT Filed: May 13, 2022

(86) PCT No.: PCT/CN2022/092722
§ 371 (c)(1),
(2) Date: May 29, 2022

(87) PCT Pub. No.: WO2023/206625
PCT Pub. Date: Nov. 2, 2023

(65) Prior Publication Data
US 2024/0162394 A1 May 16, 2024

(30) Foreign Application Priority Data

Apr. 25, 2022 (CN) .......................... 202210442329.8

(51) Int. Cl.
*H10H 20/855* (2025.01)
*H10H 20/01* (2025.01)
(Continued)

(52) U.S. Cl.
CPC ........ *H10H 20/855* (2025.01); *H10H 20/852* (2025.01); *H10W 90/00* (2026.01); *H10H 20/0362* (2025.01); *H10H 20/0363* (2025.01)

(58) Field of Classification Search
CPC ............... H10H 20/855; H10H 20/852; H10H 20/0362; H10H 20/0363; H10H 29/142;
(Continued)

(56) References Cited

U.S. PATENT DOCUMENTS

2016/0221293 A1* 8/2016 Park ........................ B32B 37/14
2019/0025647 A1* 1/2019 Cheng ............... G02F 1/133606
(Continued)

FOREIGN PATENT DOCUMENTS

CN       110085769 A       8/2019
CN       112786742 A       5/2021
(Continued)

OTHER PUBLICATIONS

Indium-gallium-zinc-oxide layer used to increase light transmittance efficiency Shinya Yoshidomi, Shunsuke Kimura, Masahiko Hasumi, and Toshiyuki Sameshima Tokyo University of Agriculture and Technology, Koganei, Tokyo 184-8588, Japan (Year: 2015).*
(Continued)

*Primary Examiner* — Chad M Dicke
*Assistant Examiner* — Jeremy Daniel Watts
(74) *Attorney, Agent, or Firm* — PV IP PC; Christopher S. Ruprecht; Wei Te Chung

(57) ABSTRACT

The present disclosure provides a display device and a manufacturing method thereof. The display device includes: a driving substrate; light-emitting elements electrically connected to the driving substrate through a connecting part, and first intervals formed between two adjacent light-emitting elements; a light-shielding layer filled in the first intervals between the two adjacent light-emitting elements;
(Continued)

200 and an encapsulation substrate disposed corresponding to the light-emitting elements. The encapsulation substrate includes a buffer layer, and a surface of a light-emitting part facing away from the driving substrate is in contact with to the buffer layer.

7 Claims, 6 Drawing Sheets

(51) Int. Cl.
　　　*H10H 20/852*　　　(2025.01)
　　　*H10W 90/00*　　　(2026.01)

(58) Field of Classification Search
　　　CPC .... H10H 20/853; H10H 29/10; H10H 29/034;
　　　　　　　H10H 29/036; H10H 29/0362; H10H
　　　　　　　29/37; H10H 29/41; H10H 29/45; H10H
　　　　　　　29/85; H10H 29/8508; H10H 29/852;
　　　　　　　H10H 29/8552; H10H 29/8585; H01L
　　　　　　　　　　　　　　25/167; H01L 25/0753
　　　See application file for complete search history.

(56)　　　　　　　　References Cited

U.S. PATENT DOCUMENTS

| | | | | |
|---|---|---|---|---|
| 2021/0380740 A1* | 12/2021 | Yagi | .................... | C08F 214/262 |
| 2022/0336525 A1* | 10/2022 | Li | ........................ | H10H 29/142 |
| 2024/0268181 A1* | 8/2024 | Zhao | ...................... | G02B 5/208 |
| 2025/0022865 A1* | 1/2025 | Kamijo | .............. | H10H 29/8552 |
| 2025/0022996 A1* | 1/2025 | Miwa | .................. | H10H 20/856 |

FOREIGN PATENT DOCUMENTS

| | | |
|---|---|---|
| CN | 112885247 A | 6/2021 |
| CN | 113871379 A | 12/2021 |
| CN | 114122234 A | 3/2022 |
| JP | 2010085645 A | 4/2010 |

OTHER PUBLICATIONS

Fabrication of SiO2/TiO2 double layer thin films with self-cleaning and photocatalytic properties—Scientific Figure on ResearchGate. Available from: https://www.researchgate.net/figure/Transmittance-spectra-of-SiO2-TiO2-and-SiO2-TiO2-thin-films_fig5 _303826508 (Year: 2016).*

* cited by examiner

100

200

110

120

<u>120</u>

<u>130</u>

DISPLAY DEVICE AND MANUFACTURING METHOD OF DISPLAY DEVICE

FIELD OF DISCLOSURE

The present disclosure relates to a field of display technologies, and particularly to a display device and a manufacturing method of the display device.

BACKGROUND OF DISCLOSURE

Compared with organic light emitting diodes (OLEDs) and liquid crystal displays (LCDs), millimeter light emitting diodes (mini-LEDs) or micron light emitting diodes (micro-LEDs) have lower power consumption, a shorter response time, higher pixel density (PPI), and a higher color gamut.

In order to reduce optical crosstalk between mini-LED or micro-LED chips, generally after forming the mini-LED or micro-LED chips on a driving substrate, thick black glues are made on a whole surface of the Mini-LED or Micro-LED chips to form black glues on a side surface of the Mini-LED or Micro-LED chips to block light emitted from the side surface of the Mini-LED or Micro-LED chips.

SUMMARY OF DISCLOSURE

Technical Problem

The above method can indeed reduce optical crosstalk to a certain extent, but there will be black glues remained on a front surface of Mini-LED or Micro-LED chips, causing a serious brightness loss of the chips.

Technical Solutions

In view of this, the present disclosure provides a display device and a manufacturing method of the display device capable of improving optical crosstalk without affecting front light-emitting brightness.

To solve the above technical problem, technical solutions provided by the present disclosure are as follows:

In a first aspect, the present disclosure provides a display device, including:

a driving substrate;

at least two light-emitting elements, each of the light-emitting elements comprising a light-emitting part and a connecting part formed on the light-emitting part, the light-emitting element electrically connected to the driving substrate through the connecting part, adjacent two of the light-emitting elements emitting light with different colors, and a first interval formed between the adjacent two of the light-emitting elements;

a light-shielding layer filled in the first interval between adjacent two of the light-emitting elements; and an encapsulation substrate disposed corresponding to the light-emitting elements; the encapsulation substrate comprising a buffer layer, and a surface of the light-emitting part away from the driving substrate being in contact with the buffer layer.

In an optional embodiment of the present disclosure, the display device further includes a first encapsulation layer formed on the driving substrate and cladding at least one portion of the connecting part.

In an optional embodiment of the present disclosure, the first encapsulation layer is transparent.

In an optional embodiment of the present disclosure, a light transmittance of the first encapsulation layer is greater than 99%.

In an optional embodiment of the present disclosure, the encapsulation substrate further includes:

a first substrate disposed facing the light-emitting elements; the buffer layer being formed on a side of the first substrate facing the light-emitting element; and a supporting layer formed on the first substrate, disposed around the buffer layer, and supported on the driving substrate.

In an optional embodiment of the present disclosure, a light transmittance of the buffer layer is greater than or equal to 95%.

In an optional embodiment of the present disclosure, the buffer layer is in contact with the light-emitting element and the light-shielding layer.

In an optional embodiment of the present disclosure, a surface of the light-shielding layer facing away from the first encapsulation layer and a surface of the light-emitting part of the light-emitting element facing away from the first encapsulation layer are on a same surface.

In an optional embodiment of the present disclosure, the buffer layer has a plurality of second intervals, the second intervals are positioned opposite to the first intervals, and a portion of the light-shielding layer is also filled in the second intervals.

In an optional embodiment of the present disclosure, a third interval is formed between the supporting layer, the buffer layer, and the light-emitting element, and a portion of the light-shielding layer is also filled in the third interval.

In an optional embodiment of the present disclosure, one end of the light-shielding layer in the third interval is in contact with the first encapsulation layer, and another end is in contact with the first substrate.

In an optional embodiment of the present disclosure, one end of the light-shielding layer in the third interval is in contact with the first encapsulation layer, and another end is in contact with the buffer layer.

In an optional embodiment of the present disclosure, the driving substrate comprises a second substrate and a thin film transistor array layer formed on the second substrate, the connecting part of the light-emitting element is electrically connected to the thin film transistor array layer, and a light transmittance of the thin film transistor array layer is greater than 80%.

In a second aspect, the present disclosure provides a manufacturing method of a display device, including:

providing a driving substrate and an encapsulation substrate;

transferring at least two light-emitting elements to the driving substrate, a first interval is formed between the adjacent two of the light-emitting elements;

aligning and pressing together the encapsulation substrate with the driving substrate having the light-emitting elements;

curing the pressed encapsulation substrate and the driving substrate; and preparing light-shielding materials into a liquid mixture, injecting the liquid mixture into at least the first interval, and then curing the liquid mixture to obtain a light-shielding layer; the light-shielding layer being filled in the first interval.

In an optional embodiment of the present disclosure, the light-emitting elements including a light-emitting part and a connecting part formed on the light-emitting part, the light-emitting elements are electrically connected to the driving substrate through the connecting part, and before the step of aligning the encapsulation substrate and the driving substrate having the light-emitting elements, the manufacturing method further includes:

coating a first encapsulation material on the driving substrate and making the first encapsulation material clad at least one portion of the connecting part; and curing the first encapsulation material to obtain a first encapsulation layer.

In an optional embodiment of the present disclosure, a viscosity of the liquid mixture is below 100 cp.

In an optional embodiment of the present disclosure, the liquid mixture is selected from at least one of black glue, black oil, and reflective ink.

In an optional embodiment of the present disclosure, a manufacturing method for the encapsulation substrate includes:

providing a first substrate; and forming a buffer layer and a supporting layer on the first substrate;

wherein, the supporting layer is disposed around the buffer layer and supported on the driving substrate, and the buffer layer is in contact with the light-emitting elements.

In an optional embodiment of the present disclosure, after forming a buffer layer on the substrate, the manufacturing method for the encapsulation substrate further comprises: patterning the buffer layer to obtain a plurality of second intervals, and the second intervals are positioned opposite to the first intervals.

In an optional embodiment of the present disclosure, after preparing the light-shielding materials into a liquid mixture, injecting the liquid mixture into at least the first interval, and then curing the liquid mixture to obtain a light-shielding layer, further includes:

filling the liquid mixture into the second intervals.

Beneficial Effect

In the display device and the manufacturing method of the display device provided by the present disclosure, after the light-emitting element is formed on the driving substrate, the driving substrate and the encapsulation substrate are aligned and pressed together, and then the light-shielding layer is formed by injecting liquid mixture into intervals between adjacent two of the light-emitting elements. The light-shielding layer can not only improve the light crosstalk, but also does not affect the front light-emitting brightness of the light-emitting elements, thereby reducing the brightness loss of the light-emitting elements.

BRIEF DESCRIPTION OF DRAWINGS

In order to explain embodiments or technical solutions in the prior art more clearly, the following will briefly introduce drawings involved in a following description of the embodiments or the prior art. Obviously, the drawings in the following description are merely disclosures. Those of ordinary skill in the art can obtain other drawings based on these drawings without creative work.

DETAILED DESCRIPTION OF EMBODIMENTS

Figure 1:
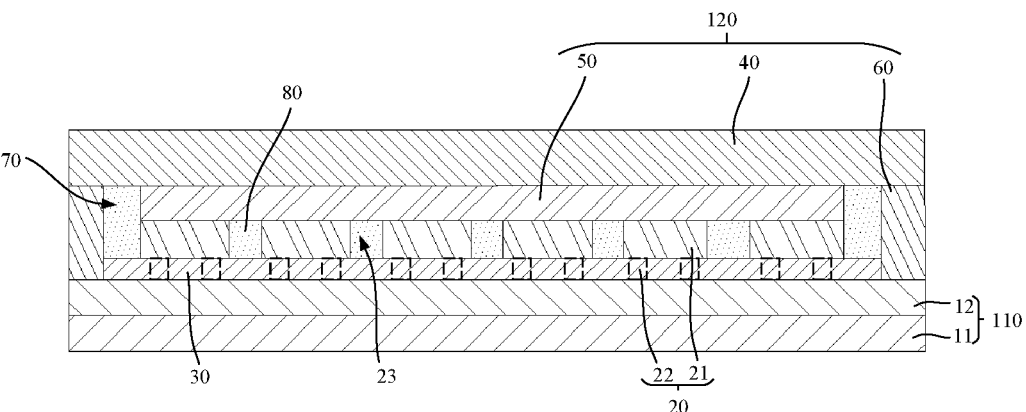
FIG. 1 is a cross-sectional view of a display device according to a first embodiment of the present disclosure.

The technical solutions in the embodiments of the present disclosure will be clearly and completely described in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those skilled in the art without creative work shall fall within a protection scope of the present disclosure.

In the description of the present disclosure, it should be understood that, an orientation or positional relationship indicated by terms "upper", "lower", etc. are based on an orientation or positional relationship shown in the drawings, and is only for convenience of describing the disclosure and simplifying the description. It does not indicate or imply that a pointed device or an element must have a specific orientation, or be configured and operated in a specific orientation, and therefore it cannot be understood as a limitation of the present disclosure. In addition, terms "first" and "second" are only used for descriptive purposes, and cannot be understood as indicating or implying relative importance or implicitly indicating a number of indicated technical features. Therefore, the features defined with "first" and "second" may explicitly or implicitly include one or more of the features. In the description of the present disclosure, "a plurality of" means two or more, unless otherwise specifically defined.

The present disclosure may repeat reference numerals and/or reference letters in different implementations, and this repetition is for a purpose of simplification and clarity, and does not indicate a relationship between various embodiments and/or settings discussed.

The display device and the manufacturing method of the display device provided by the present disclosure will be described in detail below in conjunction with specific embodiments.

Please refer to FIG. 1, a display device 100 is provided by the first embodiment of the present disclosure. The display device 100 includes a driving substrate 110, at least two light-emitting elements 20, a first encapsulation layer 30, a light-shielding layer 80, and an encapsulation substrate 120. Each of the light-emitting elements 20 includes a light-emitting part 21 and a connecting part 22 formed on the light-emitting part 21, and the light-emitting element 20 is electrically connected to the driving substrate 110 through the connecting part 22; adjacent two of the light-emitting elements 20 are able to emit light with different colors, and a first interval 23 is formed between adjacent two of the light-emitting elements 20. The first encapsulation layer 30 is formed on the driving substrate 110 and dads at least one portion of the connecting part 22.

Wherein, the driving substrate 110 includes a second substrate 11 and a thin film transistor array layer 12 formed on the second substrate 11, the connecting part 22 of the light-emitting element 20 is electrically connected to the thin film transistor array layer 12. The thin film transistor array layer 12 is used to drive the light-emitting part 21 of the light-emitting element 20 to emit light.

In this embodiment, the second substrate 11 is a transparent glass. Of course, the second substrate 11 may also be made of materials other than transparent glass, such as a ceramic material.

Wherein, the thin film transistor array layer 12 includes a plurality of driving transistors (not shown), and each of the driving transistors includes a gate electrode, an active layer, and a source and drain electrode layer; the active layer is positioned opposite to the gate electrode, and the source and drain electrode layer is positioned opposite to and electrically connected to the active layer; and the source and drain electrode layer is electrically connected to the connecting part 22 of the light-emitting element 20. The driving transistor further includes a gate insulating layer, a passivation layer, and a planarization layer; the gate insulating layer covers the active layer, and the passivation layer covers the source and drain electrode layer; the planarization layer is formed on the passivation layer, and the light-emitting element 20 is formed on the planarization layer. Of course, the driving transistor is not limited to the above description, and may also have other structures. Wherein, the driving transistor may be a bottom gate structure, a top gate structure, a double gate structure, etc., which may be determined according to an actual situation. In an embodiment, the driving transistor is a top gate structure, and a light transmittance of the driving transistor of the top gate structure is greater, which is conducive to transparent display.

Wherein, a light transmittance of the thin film transistor array layer 12 is greater than 80%.

In the present disclosure, the light-emitting elements 20 are at least one of LEDs, mini-LEDs, micro-LEDs, and the like. It is known that the light-emitting element 20 is not limited to LED, but may also be other light sources.

The light-emitting elements 20 may emit light with different colors. For example, the light-emitting elements 20 may be a red light-emitting element (R) emitting red light, a green light-emitting element (G) emitting green light, and a blue light-emitting element (B) emitting blue light, etc. In an embodiment, the light-emitting elements 20 are arrayed on the thin film transistor array layer 12 in an RGB manner. Of course, in another embodiment, the light-emitting elements 20 is not limited to the RGB manner, and may also be arranged in RGBW manner or other manners.

Wherein, the connecting part 22 of the light-emitting element 20 may be a connecting terminal or the like for electrically connecting other elements.

Wherein, the first encapsulation layer 30 is mainly used for fixing the light-emitting elements 20. The first encapsulation layer 30 clads at least one portion of the connecting part 22. Specifically, in this embodiment, a surface of the first encapsulation layer 30 facing away from the driving substrate 110 is in contact with a surface of the light-emitting part 21 of the light-emitting element 20 facing the driving substrate 110, that is, a vertical distance from the surface of the first encapsulation layer 30 facing away from the driving substrate 110 to the surface of the light-emitting part 21 of the light-emitting element 20 facing the driving substrate 110 is equal to 0. In another embodiment, the first encapsulation layer 30 may also cover a portion of the connecting part 22. At this moment, the vertical distance from the surface of the first encapsulation layer 30 facing away from the driving substrate 110 to the surface of the light-emitting part 21 of the light-emitting element 20 facing the driving substrate 110 is greater than 0. In this way, light emission of the light-emitting part 21 can be ensured, thereby reducing light loss of the light-emitting elements 20.

In an optional embodiment of the present disclosure, the first encapsulation layer 30 is transparent, and a light transmittance of the first encapsulation layer 30 is greater than 99%. The first encapsulation layer 30 is conducive to transparent display.

Wherein, a material of the light-shielding layer 80 may be at least one of black glue, black oil, reflective ink, etc. In this embodiment, the material of the light-shielding layer 80 is black glue or black oil. Wherein, the reflective ink includes an ink matrix and reflective particles dispersed in the ink matrix, and optical crosstalk between adjacent light-emitting elements can be better reduced by adjusting ratios of the reflective particles in the ink matrix.

In this embodiment, a surface of the light-shielding layer 80 facing away from the first encapsulation layer 30 is flush with a surface of the light-emitting part 21 of the light-emitting element 20 facing away from the first encapsulation layer 30, that is, the surface of the light-shielding layer 80 facing away from the first encapsulation layer 30 and the surface of the light-emitting part 21 of the light-emitting element 20 facing away from the first encapsulation layer 30 are on a same surface.

Wherein, the encapsulation substrate 120 further includes a first substrate 40, a buffer layer 50, and a supporting layer 60. Wherein, the first substrate 40 is disposed facing the light-emitting elements 20; the buffer layer 50 is formed on a side of the first substrate 40 facing the light-emitting elements 20, and the supporting layer 60 is formed on the first substrate 40, is disposed around the buffer layer 50, and is supported on the driving substrate 40. Specifically, the supporting layer 60 is disposed on the thin film transistor array layer 12.

In an optional embodiment of the present disclosure, a material of the first substrate 40 is transparent glass. Of course, the first substrate 40 may also be made of materials other than transparent glass, such as ceramic material.

In an optional embodiment of the present disclosure, a light transmittance of the buffer layer 50 is greater than or equal to 95%, so as to facilitate transparent display.

In this embodiment, the buffer layer 50 is in contact with the light-emitting part 21 of the light-emitting element 20 and the light-shielding layer 80, that is, no holes or slots are formed at a portion of the buffer layer 50 corresponding to the light-emitting elements 20 and the light-shielding layer 80.

In an optional embodiment of the present disclosure, a third interval 70 is formed between the supporting layer 60, the buffer layer 50, and the light-emitting elements 20, and a portion of the light-shielding layer 80 is also filled in the third interval 70.

In this embodiment, one end of the light-shielding layer 80 in the third interval 70 is in contact with the first encapsulation layer 30, and another end is in contact with the first substrate 40. In another embodiment, one end of the light-shielding layer 80 in the third interval 70 is in contact with the first encapsulation layer 30, and another end is in contact with the buffer layer 50.

In this embodiment, the buffer layer 50 is in contact with the light-emitting part 21 of the light-emitting element 20 and the light-shielding layer 80, that is, no holes or slots are formed at a portion of the buffer layer 50 corresponding to the light-emitting elements 20 and the light-shielding layer 80.

Referring to FIGS. 3-11 and FIGS. 1 and 2, the present disclosure further provides a manufacturing method of the display device 100/200, including:

Step S1, please refer to FIG. 3 and FIGS. 5 to 7, the driving substrate 110 and the encapsulation substrate 120 or 130 are provided.

Wherein, please refer to FIG. 1 again, the driving substrate 110 includes the second substrate 11 and the thin film transistor array layer 12 formed on the second substrate 11. The connecting part 22 of the light-emitting element 20 is electrically connected to the thin film transistor array layer 12. The thin film transistor array layer 12 is used for driving the light-emitting part 21 of the light-emitting element 20 to emit light.

In this embodiment, the second substrate 11 is a transparent glass. Of course, the second substrate 11 may also be made of materials other than transparent glass, such as a ceramic material.

Wherein, the thin film transistor array layer 12 includes a plurality of driving transistors (not shown), and each of the driving transistors includes a gate electrode, an active layer, and a source and drain electrode layer; the active layer is positioned opposite to the gate electrode, and the source and drain electrode layer is positioned opposite to and electrically connected to the active layer; and the source and drain electrode layer is electrically connected to the connecting part 22 of the light-emitting element 20. The driving transistor further includes a gate insulating layer, a passivation layer, and a planarization layer; the gate insulating layer covers the active layer, and the passivation layer covers the source and drain electrode layer; the planarization layer is formed on the passivation layer, and the light-emitting element 20 is formed on the planarization layer. Of course, the driving transistor is not limited to the above description, and may also have other structures. Wherein, the driving transistor may be a bottom gate structure, a top gate structure, a double gate structure, etc., which may be determined according to an actual situation. In an embodiment, the driving transistor is a top gate structure, and a light transmittance of the driving transistor of the top gate structure is greater, which is conducive to transparent display.

Wherein, a light transmittance of the thin film transistor array layer 12 is greater than 80%.

Wherein, please refer to FIGS. 5 and 6 again, the encapsulation substrate 120 further includes the first substrate 40, the buffer layer 50, and the supporting layer 60. The supporting layer 60 is formed on the first substrate 40 and disposed around the buffer layer 50. In an optional embodiment of the present disclosure, there is no contact between the supporting layer 60 and the buffer layer 50. In another embodiment, the supporting layer 60 may be in contact with the buffer layer 50.

In an optional embodiment of the present disclosure, a material of the first substrate 40 is transparent glass. Of course, the first substrate 40 may also be made of materials other than transparent glass, such as ceramic material.

In an optional embodiment of the present disclosure, the light transmittance of the buffer layer 50 is greater than or equal to 95%, so as to facilitate transparent display.

Wherein, please refer to FIG. 7 again, a structure of the display device 200 is similar to a structure of the display device 100. Differences between an encapsulation substrate 130 of the display device 200 and the encapsulation substrate 120 of the display device 100 are only in that: the buffer layer 50 includes a plurality of second intervals 51, and the second intervals 51 are positioned opposite to the first intervals 23, and a portion of the light-shielding layer 80 is also filled in the second intervals 51. The buffer layer 50 is only in contact with the light-emitting elements 20.

Wherein, a manufacturing method for the encapsulation substrate 120 includes: firstly, a first substrate 40 is provided; secondly, a buffer layer 50 and a supporting layer 60 are formed on the first substrate 40, and the support layer 60 surrounds the buffer layer 50; thirdly, the substrate 120 is pre-cured to maintain shapes of the support layer 60 and the buffer layer 50.

Wherein, a manufacturing method for the encapsulation substrate 130 includes: firstly, a first substrate 40 is provided; secondly, a buffer layer 50 and a supporting layer 60 are formed on the first substrate 40, and the support layer 60 surrounds the buffer layer 50; thirdly, the buffer layer 50 is patterned to obtain a plurality of second intervals 51; after that, the substrate 120 is pre-cured to maintain the shapes of the support layer 60 and the buffer layer 50.

Figure 3:
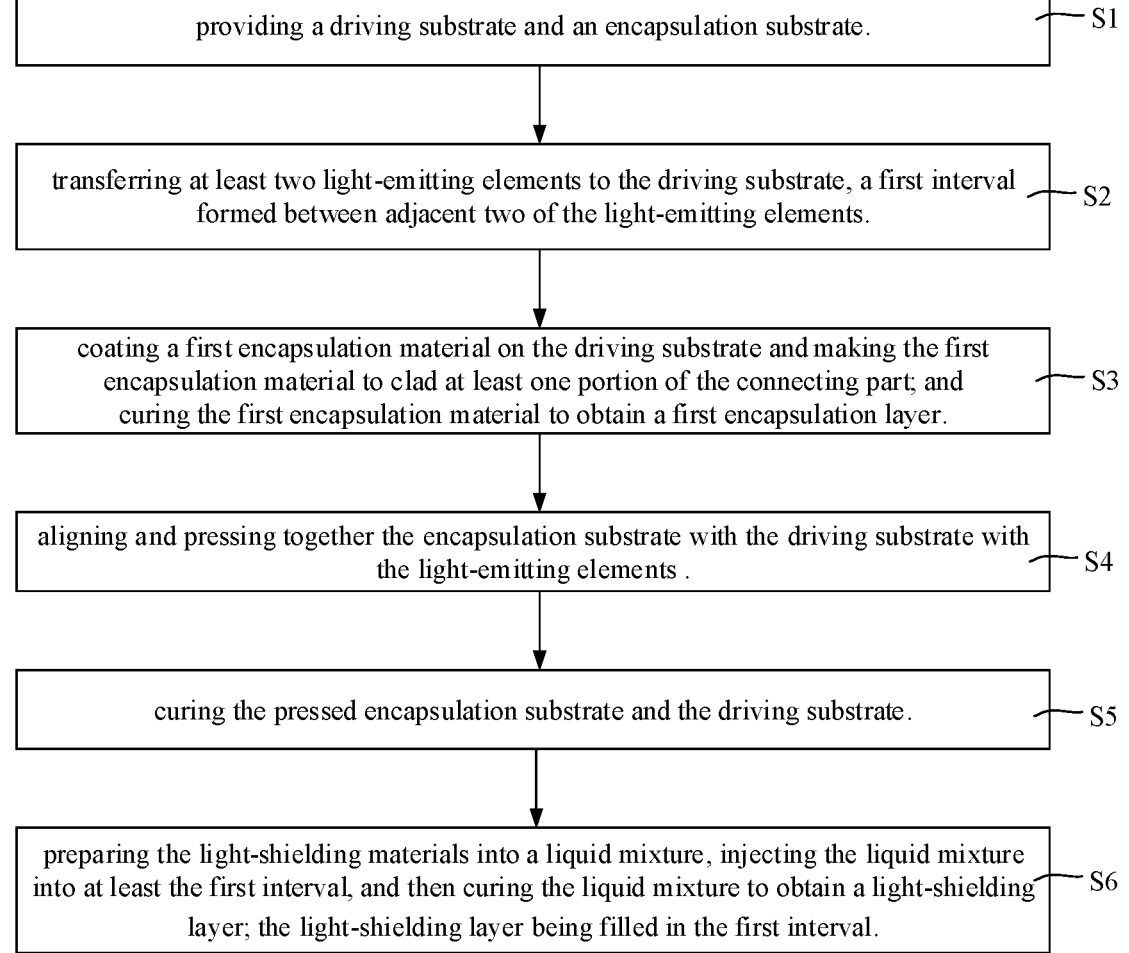
FIG. 3 is a flow chart of a manufacturing method of the display device shown in FIG. 1 or FIG. 2.
Figure 4:
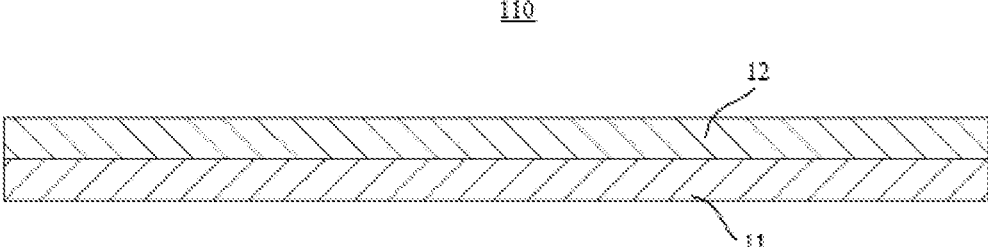
FIG. 4 is a cross-sectional view of a driving substrate provided by the present disclosure.
Figure 5:
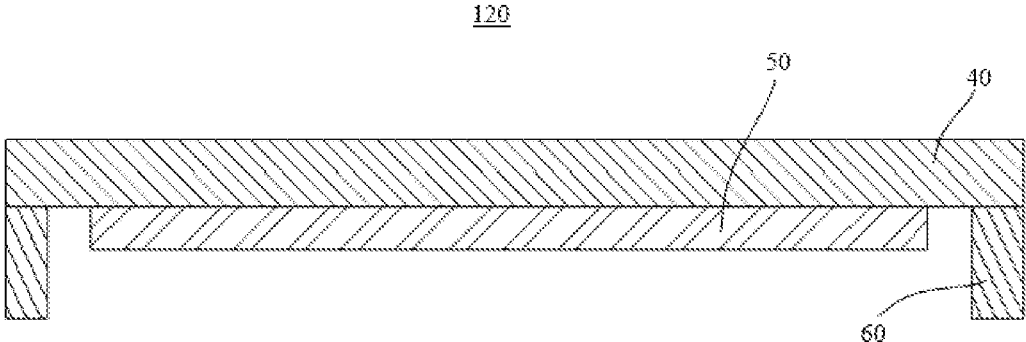
FIG. 5 is a cross-sectional view of an encapsulation substrate provided by the present disclosure.
Figure 6:
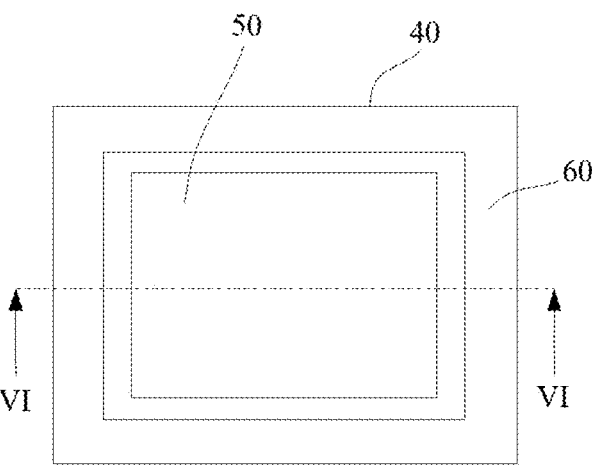
FIG. 6 is a top view of the encapsulation substrate shown in FIG. 5.
Figure 7:
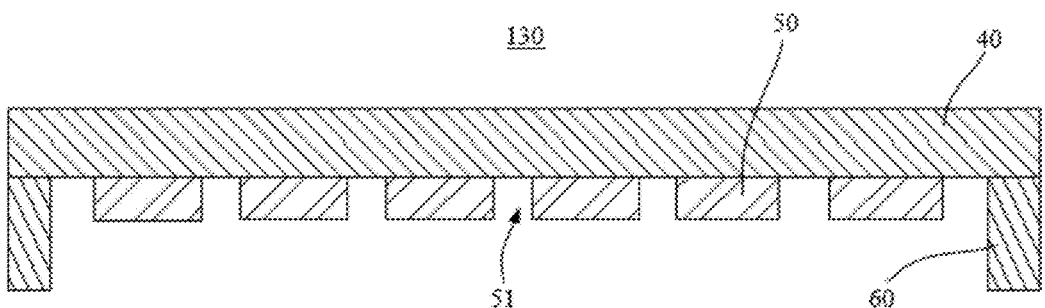
FIG. 7 is a cross-sectional view of another encapsulation substrate provided by the present disclosure.
Figure 8:
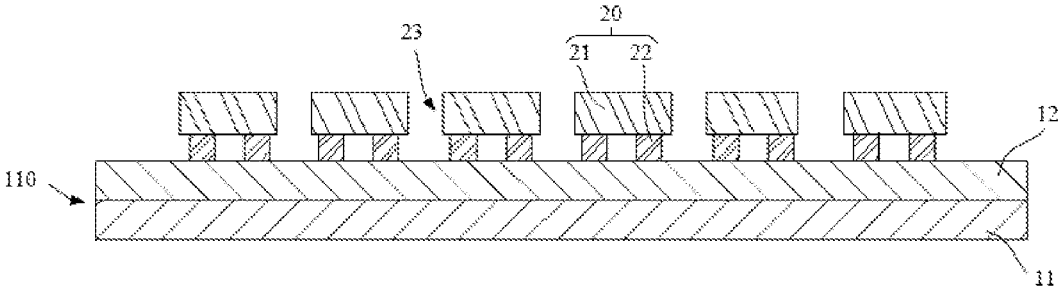
FIG. 8 is a cross-sectional view after forming a plurality of light-emitting elements on the driving substrate shown in FIG. 4.

Step S2, please refer to FIGS. 3 and 8, at least two light-emitting elements 20 are transferred to the driving substrate 110, adjacent two of the light-emitting elements 20 are able to emit light with different colors, and a first interval 23 is formed between adjacent two of the light-emitting elements 20.

Figure 9:
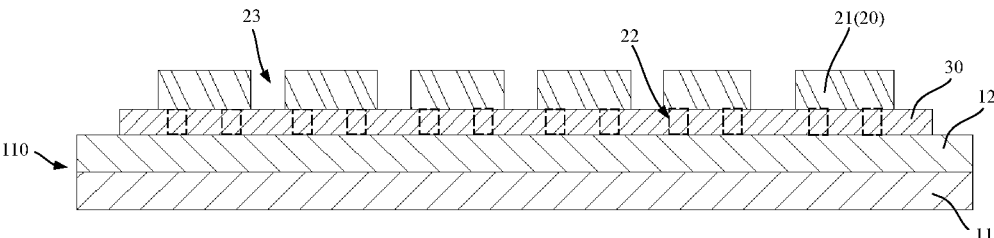
FIG. 9 is a cross-sectional view after forming a first encapsulation layer on the driving substrate shown in FIG. 8 to obtain a light-emitting display substrate.

Step S3, please refer to FIGS. 3 and 9, a first encapsulation material is coated on the driving substrate 110, the first encapsulation material dads at least one portion of the connecting part 21, and the first encapsulation material is cured to obtain a first encapsulation layer 30.

Wherein, the first encapsulation material is also filled between two adjacent connecting parts 22, and the first encapsulation layer 30 is used to fix the light-emitting elements 20 to prevent the light-emitting elements 20 from moving under action of an external force, so reliability of the electrical connection between the light-emitting elements 20 and the thin film transistor array layer 12 can be improved.

The first encapsulation layer 30 clads at least one portion of the connecting part 22. Specifically, in this embodiment, a surface of the first encapsulation layer 30 facing away from the driving substrate 110 is in contact with a surface of the light-emitting part 21 of the light-emitting element 20 facing the driving substrate 110, that is, a vertical distance from the surface of the first encapsulation layer 30 facing away from the driving substrate 110 to the surface of the light-emitting part 21 of the light-emitting element 20 facing the driving substrate 110 is equal to 0. In another embodiment, the first encapsulation layer 30 may also cover a portion of the connecting part 22. At this moment, the vertical distance from the surface of the first encapsulation layer 30 facing away from the driving substrate 110 to the surface of the light-emitting part 21 of the light-emitting element 20 facing the driving substrate 110 is greater than 0.

Wherein, the first encapsulation layer 30 is transparent, and a light transmittance of the first encapsulation layer 30 is greater than 99%.

In another embodiment, step S3 may be omitted.

Figure 10:
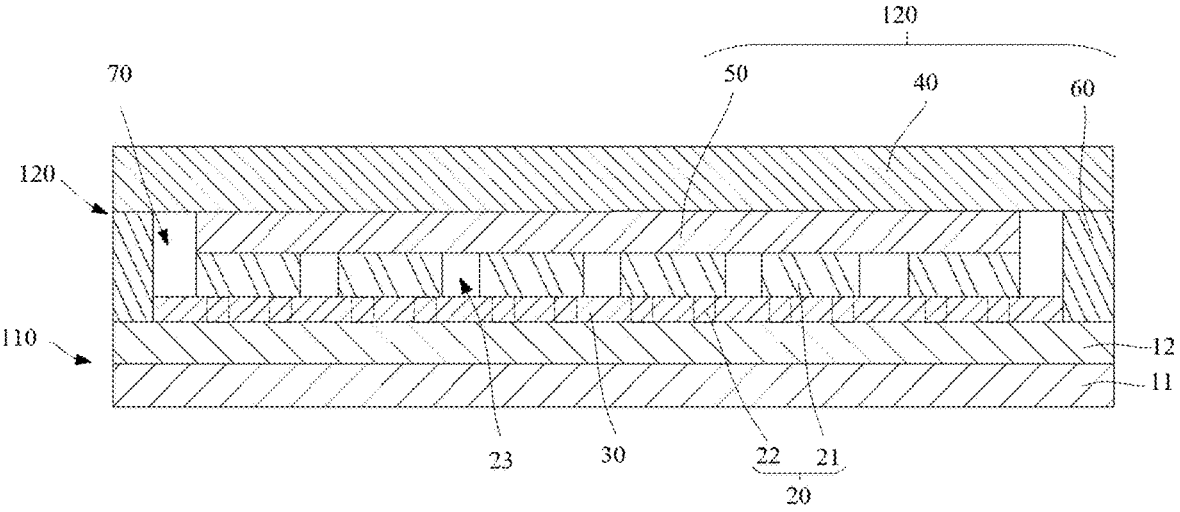
FIG. 10 is a cross-sectional view of the encapsulation substrate of FIG. 5 and the light-emitting display substrate of FIG. 9 pressed together.
Figure 11:
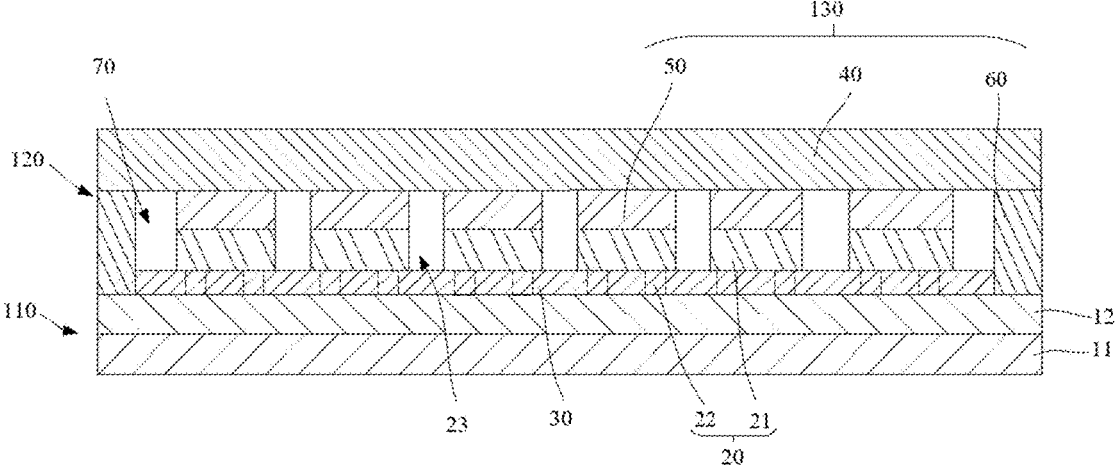
FIG. 11 is a cross-sectional view of the another encapsulation substrate of FIG. 7 and the light-emitting display substrate of FIG. 9 pressed together.

Step S4, please refer to FIGS. 3, 10, and 11, the encapsulation substrate 120 or 130 is aligned and pressed together with the driving substrate 110 having the light-emitting elements 20.

Wherein, the buffer layer 50 is pressed on the light-emitting elements 20.

Specifically, openings of one end of the first intervals 23 away from the driving substrate 110 are covered by the buffer layer 50, and the buffer layer 50 is in contact with a surface of the light-emitting part 21 of the light-emitting element 20 facing away from the connecting part 22.

Wherein, a third interval 70 is formed between the supporting layer 60, the buffer layer 50, and the light-emitting element 20.

Step S5, the pressed encapsulation substrate 120 or 130 and the driving substrate 110 are cured.

The step S5 is used to make the buffer layer 50 and the supporting layer 60 sufficiently cured and formed.

In another embodiment, step S5 may also be omitted.

Figure 2:
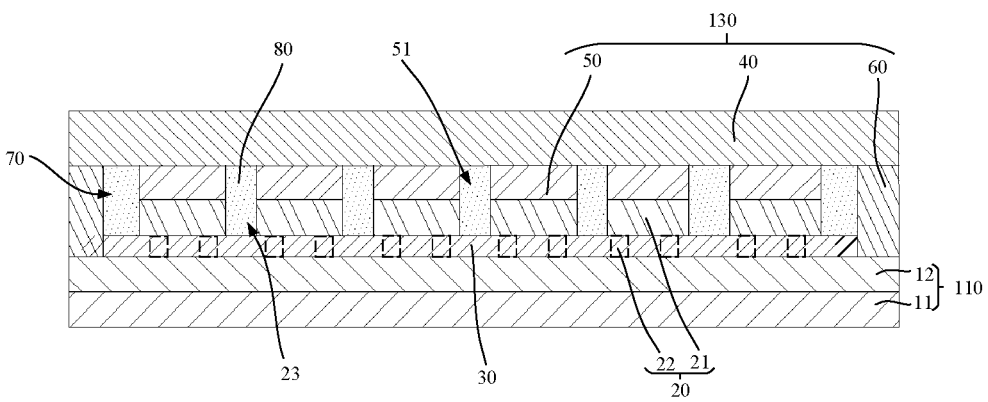
FIG. 2 is a cross-sectional view of a display device according to a second embodiment of the present disclosure.

Step S6, please refer to FIGS. 1 and 2, light-shielding materials are prepared into a liquid mixture, then the liquid mixture is injected into at least the first interval 23, and then the liquid mixture is cured to obtain a light-shielding layer 80; the light-shielding layer 80 is filled in the first interval 23.

After step S6, the display device 100 or the display device 200 is obtained.

Wherein, the liquid mixture is a low-viscosity mixture, so as to form the light-shielding layer 80 by injection. Specifically, a viscosity of the liquid mixture is below 100 cp.

Wherein, wherein the liquid mixture is selected from at least one of black glue, black oil, reflective ink, etc.

Wherein, the reflective ink includes an ink matrix and reflective particles dispersed in the ink matrix, and optical crosstalk between adjacent light-emitting elements can be better reduced by adjusting ratios of the reflective particles in the ink matrix.

Please refer to FIG. 1 again, the buffer layer 50 of the display device 100 is in contact with the light-emitting portion 21 of the light-emitting element 20 and the light-shielding layer 80, that is, no holes or slots are formed at a portion of the buffer layer 50 corresponding to the light-emitting elements 20 and the light-shielding layer 80.

Please refer to FIG. 2 again, the buffer layer 50 of the display device 200 includes a plurality of second intervals 51, and the second intervals 51 are positioned opposite to the first intervals 23. Correspondingly, step S6 further includes: injecting the liquid mixture into the second intervals 51. Correspondingly, the buffer layer 50 is only in contact with the light-emitting elements 20.

In an optional embodiment of the present disclosure, a third interval 70 is formed between the supporting layer 60, the buffer layer 50, and the light-emitting elements 20, and a portion of the liquid mixture is also filled in the third interval 70.

In step S6, UV curing is generally adopted to cure the liquid mixture, and a curing temperature is lower than 100° C. Of course, other curing methods can also be adopted for curing.

In the display device and the manufacturing method of the display device provided by the present disclosure, after the light-emitting element is formed on the driving substrate, the driving substrate and the encapsulation substrate are aligned and pressed together, and then the light-shielding layer is formed by injecting the light-shielding materials into intervals between adjacent two of the light-emitting elements, which not only can improve the light crosstalk, but also does not affect front light-emitting brightness of the light-emitting elements, thereby reducing brightness loss of the light-emitting elements.

The display device and the manufacturing method of the display device provided by the embodiments of the present disclosure have been described above in detail, and specific examples are used in this paper to illustrate principles and implementations of the present invention. The description of the above embodiments is only used to help understand the technical solutions and core ideas of the disclosure, those of ordinary skill in the art should understand that: they can still modify the technical solutions recorded in the foregoing embodiments, or equivalently replace some of the technical features, and these modifications or replacements do not cause the essence of the corresponding technical solutions to deviate from the scope of the technical solutions of the embodiments of the present disclosure.

What is claimed is:

1. A display device, wherein the display device comprises:
a driving substrate;
at least two light-emitting elements, the light-emitting elements comprising a light-emitting part and a connecting part formed on the light-emitting part, the light-emitting element electrically connected to the driving substrate through the connecting part, adjacent two of the light-emitting elements emitting light with different colors, and a first interval formed between the adjacent two of the light-emitting elements;
a light-shielding layer filled in the first interval between the adjacent two of the light-emitting elements, wherein the light-shielding layer is in direct contact with both of the adjacent two of the light-emitting elements; and
an encapsulation substrate disposed corresponding to the light-emitting elements; the encapsulation substrate comprising a buffer layer, and a surface of the light-emitting part away from the driving substrate being in contact with the buffer layer;
wherein the display device further comprises a first encapsulation layer formed on the driving substrate and cladding at least one portion of the connecting part;
wherein a top surface of the light-shielding layer facing away from the first encapsulation layer is flush with a surface of the light-emitting part of the light-emitting elements facing away from the first encapsulation layer;
wherein the encapsulation substrate further comprises: a first substrate disposed facing the light-emitting elements; the buffer layer being formed on a side of the first substrate facing the light-emitting elements; and a supporting layer formed on the first substrate, disposed around the buffer layer, and directly supported on the driving substrate;
wherein the buffer layer has a plurality of second intervals, positioned vertically opposite to the first interval, wherein a portion of the light-shielding layer is also filled in the second intervals; wherein one end of the light-shielding layer in the second interval is in direct contact with the light-shielding layer in the first interval, and another end is in direct contact with the first substrate;
wherein a third interval is formed between the supporting layer, the buffer layer, and the light-emitting elements, and a portion of the light-shielding layer is also filled in the third interval; wherein one end of the light-shielding layer in the third interval is in contact with the first encapsulation layer, and another end is in direct contact with the first substrate.

2. The display device in claim 1, wherein the first encapsulation layer is transparent.

3. The display device in claim 2, wherein a light transmittance of the first encapsulation layer is greater than 99%.

4. The display device in claim 1, wherein a light transmittance of the buffer layer is greater than or equal to 95%.

5. The display device in claim 1, wherein the buffer layer is in contact with the light-emitting elements and the light-shielding layer.

6. The display device in claim 1, wherein one end of the light-shielding layer in the third interval is in contact with the first encapsulation layer, and another end is in contact with the buffer layer.

7. The display device in claim 1, wherein the driving substrate comprises a second substrate and a thin film transistor array layer formed on the second substrate; the connecting part of the light-emitting elements is electrically connected to the thin film transistor array layer, and a light transmittance of the thin film transistor array layer is greater than 80%.

* * * * *